United States Patent
Gunda et al.

(10) Patent No.: US 7,461,307 B2
(45) Date of Patent: Dec. 2, 2008

(54) SYSTEM AND METHOD FOR IMPROVING TRANSITION DELAY FAULT COVERAGE IN DELAY FAULT TESTS THROUGH USE OF AN ENHANCED SCAN FLIP-FLOP

(75) Inventors: Arun Gunda, San Jose, CA (US); Narendra Devta-Prasanna, Bangalore (IN)

(73) Assignee: LSI Corporation, Milpitas, CA (US)

( * ) Notice: Subject to any disclaimer, the term of this patent is extended or adjusted under 35 U.S.C. 154(b) by 580 days.

(21) Appl. No.: 11/123,432

(22) Filed: May 6, 2005

(65) Prior Publication Data

US 2006/0253753 A1    Nov. 9, 2006

(51) Int. Cl.
*G01R 31/28* (2006.01)

(52) U.S. Cl. ...................................... 714/726
(58) Field of Classification Search ................... 714/726
See application file for complete search history.

(56) References Cited

U.S. PATENT DOCUMENTS

| | | | | |
|---|---|---|---|---|
| 4,602,210 A | * | 7/1986 | Fasang et al. ............... | 714/731 |
| 5,682,391 A | * | 10/1997 | Narayanan ................... | 714/731 |
| 6,023,778 A | * | 2/2000 | Li .............................. | 714/726 |
| 6,122,762 A | * | 9/2000 | Kim ........................... | 714/726 |
| 6,806,731 B2 | * | 10/2004 | Kohno ......................... | 326/38 |
| 2004/0177299 A1 | * | 9/2004 | Wang et al. ................. | 714/726 |
| 2005/0216806 A1 | * | 9/2005 | Verwegen ................... | 714/726 |

* cited by examiner

*Primary Examiner*—James C Kerveros
(74) *Attorney, Agent, or Firm*—Suiter Swantz PC LLO

(57) ABSTRACT

The present invention is directed to a system and method for improving transition delay test coverage through use of enhanced flip flops (ES flip-flops) for a broadside test approach. Each ES flip-flop includes a two port flip-flop including a first flip-flop and a second flip-flop. A separate control input (ESM) which is not time critical is used to select a multiplexer of the second flip-flop. Thus, the ES flip-flops do not require a fast signal switching between launch and test response capture or an extra clock signal. Various enhanced scan modes may be selected via a combination of SEN and ESM. Moreover, only a heuristically selected subset of scan flip-flops may be replaced with the ES flip-flops so as to minimize the length of a scan chain as well as the logic area overhead. The present invention provides high TDF coverage under the broadside testing.

20 Claims, 4 Drawing Sheets

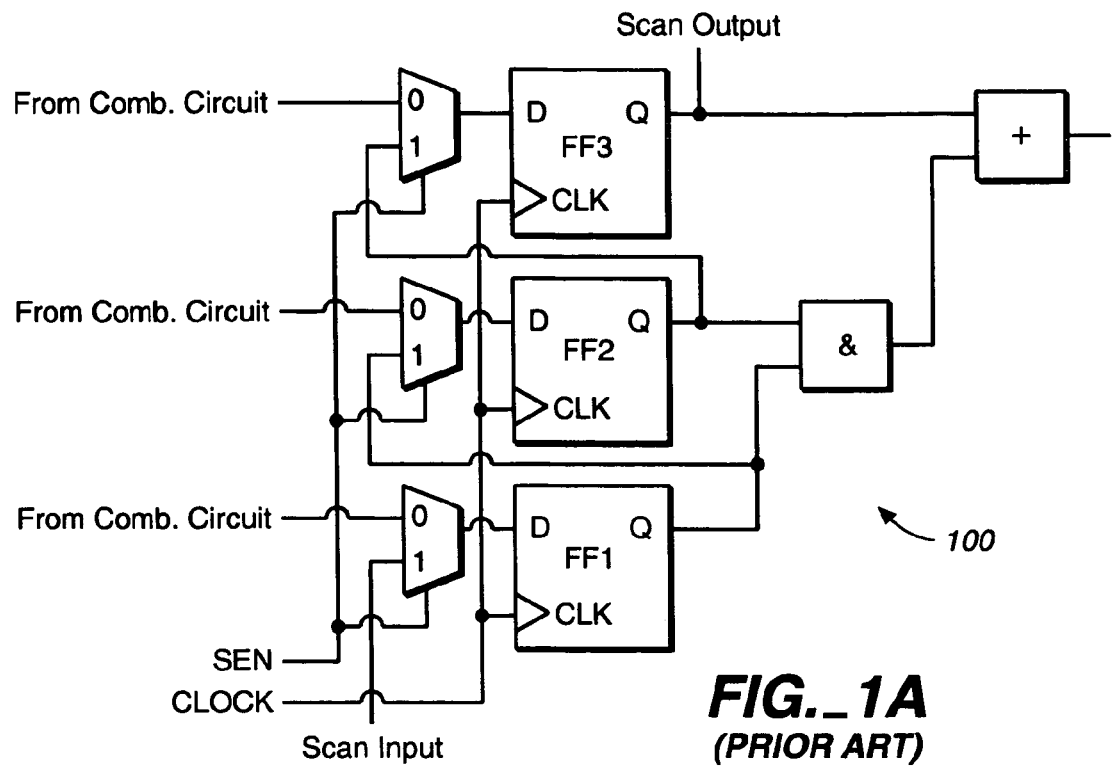
FIG._1A
*(PRIOR ART)*
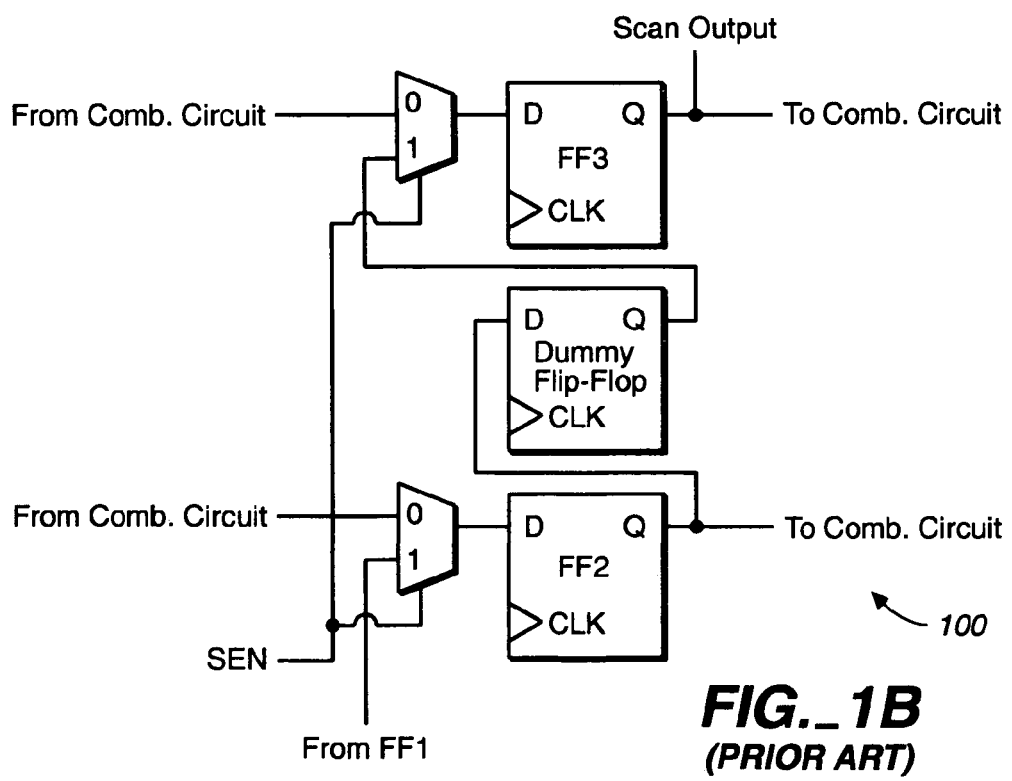
FIG._1B
*(PRIOR ART)*

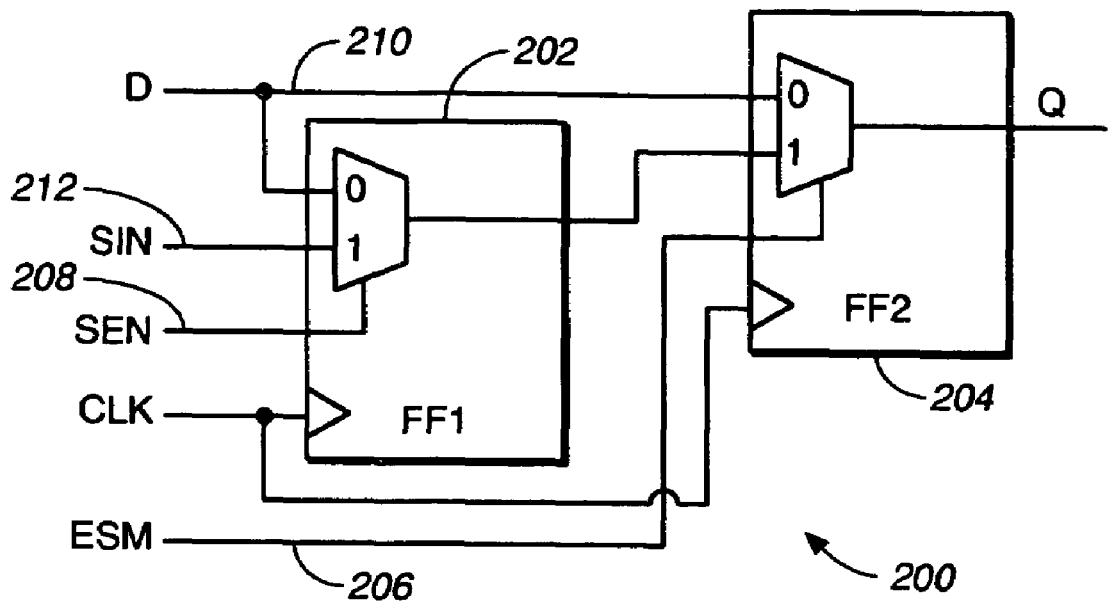
FIG._2
| SEN | ESM | Operation of Flip-Flop |
|---|---|---|
| 0 | 0 | Functional Mode / Standard Broadside Test Mode |
| 0 | 1 | Enhanced Broadside Test Mode |
| 1 | 1 | Scan Shift Mode |
| 1 | 0 | Not Allowed |
FIG._3

| FF | Affected Faults |
|---|---|
| $s_1$ | $f_1, f_4, f_5, f_6$ |
| $s_2$ | $f_3, f_6$ |
| $s_3$ | $f_1, f_2, f_5, f_7, f_8, f_9$ |
| $s_4$ | $f_1, f_4, f_8$ |
| $s_5$ | $f_2, f_{10}$ |
| $s_6$ | $f_3, f_5, f_6, f_{11}$ |
| $s_7$ | $f_{10}$ |

*FIG._4A*

| FF | Affected Faults | Rank(s) |
|---|---|---|
| $s_1$ | $f_1, f_4, f_5, f_6$ | 4 |
| $s_2$ | $f_3, f_6$ | 2 |
| $s_3$ | $f_1, f_2, f_5, f_7, f_8, f_9$ | 6 |
| $s_5$ | $f_2, f_{10}$ | 2 |
| $s_6$ | $f_3, f_5, f_6, f_{11}$ | 4 |

*FIG._4B*

| FF | Affected Faults | Rank(s) |
|---|---|---|
| $s_1$ | $f_4, f_6$ | 2 |
| $s_2$ | $f_3, f_6$ | 2 |
| $s_5$ | $f_{10}$ | 1 |
| $s_6$ | $f_3, f_6, f_{11}$ | 3 |

*FIG._4C*

| FF | Affected Faults | Rank(s) |
|---|---|---|
| $s_1$ | $f_4$ | 1 |
| $s_5$ | $f_{10}$ | 1 |

*FIG._4D*

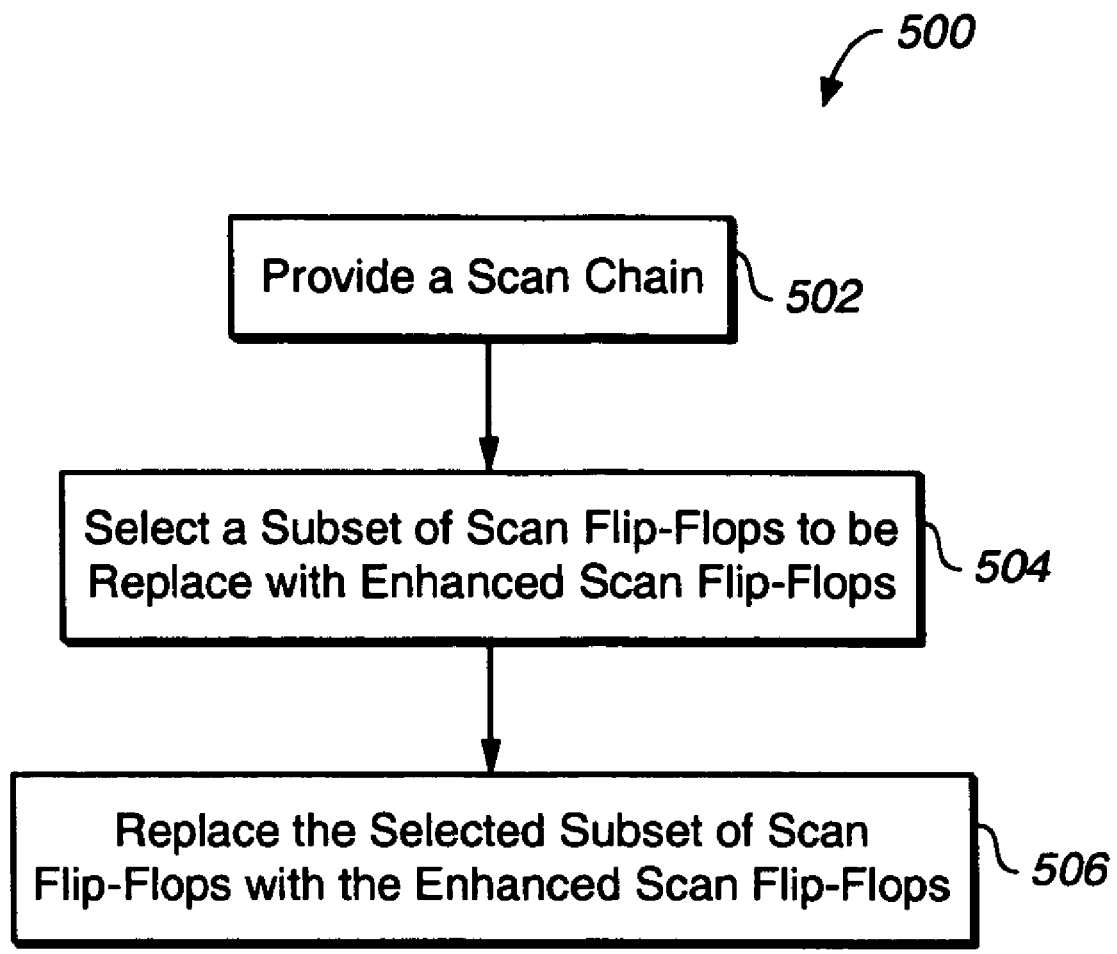
FIG._5

SYSTEM AND METHOD FOR IMPROVING TRANSITION DELAY FAULT COVERAGE IN DELAY FAULT TESTS THROUGH USE OF AN ENHANCED SCAN FLIP-FLOP

CROSS-REFERENCE TO RELATED APPLICATIONS

The present application is a U.S. patent application Ser. No. 11/124,438, filed on May 6, 2005, now U.S. Pat. No. 7,293,210, issued on Nov. 6, 2007, entitled "System and method for improving transition delay fault coverage in delay fault tests through use of transition launch flip-flop," which is herein incorporated by reference in its entirety.

FIELD OF THE INVENTION

The present invention generally relates to the field of integrated circuits, and particularly to a system and method for improving transition delay fault coverage in delay fault tests through use of an enhanced scan flip-flop.

BACKGROUND OF THE INVENTION

As integrated circuits are produced with greater and greater levels of circuit density, efficient testing schemes that guarantee very high fault coverage while minimizing test costs and chip area overhead have become essential. Particularly, verifying at-speed performance of integrated circuits is important to ensure a satisfactory shipped part quality level (SPQL). In the past, at-speed performance of integrated circuits was typically verified using functional tests. However, as the complexity and density of circuits continue to increase, high fault coverage of several types of fault models becomes more difficult to achieve with traditional testing paradigms. For example, it is not feasible to develop functional tests for today's multi-million gate designs to achieve satisfactory defect coverage due to the prohibitive cost of such development. Conventionally, the scan-based delay testing approach is used as a low-cost alternative to functional testing for verifying at-speed performance of integrated circuits.

Timing failures caused by delays may result in circuitry logic failure and eventually lead to a system failure. Thus, in the scan-based delay testing approach, performance failures are modeled as delay-causing faults and test patterns are generated by an automatic test pattern generator (ATPG).

Transition delay fault and path delay fault models are known to provide a good coverage of delay-causing faults. The transition delay fault model targets every node in the design for a slow-to-rise and a slow-to-fall delay fault whereas the path delay fault model targets the cumulative delay through paths in the circuit. Typically, the transition delay fault (TDF) test model requires two-pattern tests, involving a first pattern and a second pattern. The TDF model is commonly used in the industry since it is simple and existing ATPG algorithms can be easily adapted to generate tests for TDF faults. Conventionally, there are two accepted approaches of testing for TDF faults, such as skewed-load testing and broadside testing. Both of the two approaches may generate the first pattern called an initialization pattern. However, the two approaches differ in how the second pattern called the launch pattern is obtained.

In the broadside testing, the launch pattern is derived from the circuit response to the initialization pattern. The broadside testing requires two cycles of sequential processing. The sequential processing of the broadside testing results in long run time and lower coverage.

In the skewed-load testing, the launch pattern is obtained by a one-bit shift of the initialization pattern. The test response to the second pattern is captured by applying a system clock pulse. Generally, the skewed-load test achieves higher fault coverage than the broadside testing. However, the skewed-load testing requires that signal enable (SEN) signal has to change fast and accommodate the system clock period.

There have been many efforts to overcome the above mentioned drawbacks of the skewed-load testing. For example, a method of inserting dummy flip-flops to reduce/eliminate the correlation between test patterns and thus increase the delay fault coverage of skewed-load tests has been proposed.

FIG. 1A is a schematic block diagram of an exemplary circuit 100 utilized by prior art scan-based test methods. The slow-to-fall fault at the output of the AND gate cannot be tested with the given order of the flip-flops because the initialization condition requires FF2=1 under the first pattern whereas fault propagation requires FF3=0 under the second pattern. This conflict can be removed by inserting a dummy flip-flop in the scan path between FF2 and FF3 as shown in FIG. 1B. The dummy flip-flop stores the zero value required by FF3 under the launch pattern. The technique of inserting dummy flip-flops can guarantee the elimination of all the shift dependencies in the circuit.

However, a fast SEN signal is still needed since the test is performed under the skewed load method. Insertion of dummy flip-flops will also increase the scan chain length and hence the length of the test patterns, which is undesirable. It should be noted that the dummy flip-flops used are single port devices and not two-port standard scan cells.

In scan based testing method that uses both the broadside and the skewed load test approaches. A subset of scan cells is driven by a fast SEN signal such that the flip-flops in this subset launch and capture using skewed load, while the other flip-flops use the broadside approach. Such a method reduces the complexity of timing closure but it still requires a fast SEN signal for a subset of scan cells.

The conventional design effort involved in designing a fast SEN signal and the resulting impact on turnaround time is considered unacceptable for many scan designs. Consequently, the broadside testing is often preferred over the skewed-load testing (or any testing requiring the fast SEN signal) in scan designs that use the system clock for scan operations. As mentioned above, broadside testing does not require a fast (at-speed) scan enable signal. Additionally, some restrictions on scan designs may force testers to employ the broadside testing even though it does not provide optimal transition delay test (TDF) fault coverage.

Therefore, it would be desirable to provide a method and system which can overcome the drawbacks of the broadside testing and achieve greater TDF coverage with minimal test costs.

SUMMARY OF THE INVENTION

Accordingly, the present invention provides a system and method for increased TDF coverage under the broadside testing method. Transition delay test coverage may be improved through use of enhanced flip-flops which include a two port flip-flop in series with a scan flip-flop.

In an exemplary aspect of the present invention, a method for improving TDF coverage in delay fault testing is provided. A subset of scan flip-flops may be selected to improve TDF coverage. Next, the selected subset of scan flip-flops is converted with Enhance Scan (ES) flip-flops. Each ES flip-flop is an enhanced two port scan flip-flop including a first flip-flop and a second flip-flop. The first flip-flop and the second flip-flop are both coupled to a functional data input to the ES flip-flop. Content of the first flip-flop is shifted into the second flip-flop during a launch cycle, and the first flip-flop captures a test response during a capture cycle.

In additional exemplary aspect of the present invention, an additional control input is utilized to control a multiplexer of the second flip-flop. The additional control input is called an ESM signal. The ES flip-flop may support various modes of operations including a functional mode, a standard broadside mode, an enhanced broadside mode, and a scan shift mode. Each mode of operations may be selected via a combination of ESM and SEN signals. Advantageously, either the SEN signal or the ESM signal is not required to be at-speed (fast). In this manner, a fast control signal or an extra clock may not be required under the broadside testing.

In another exemplary aspect of the present invention, the subset of scan flip-flops which are to be replaced with the ES flip-flop may be selected from scan chains through various selection algorithms such as a topology based heuristic algorithm.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIGS. 1A and 1B illustrate a schematic block diagram of a circuit implemented under prior art scan-based test methods;

FIG. 2 is a schematic block diagram of an enhanced flip-flop in accordance with an exemplary embodiment of the present invention;

FIG. 3 illustrates a table of scan flip-flop operation modes implemented by the enhanced flip-flop in FIG. 3;

FIGS. 4A-4D illustrate an example of a subset of scan flip-flops selection procedure in accordance with an exemplary embodiment of the present invention; and FIG. 5 is a flow diagram of a method implemented in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

Referring now to FIG. 2, a schematic block diagram of an enhanced scan flip-flop 200 in accordance with the present invention is illustrated. As described above, inserting dummy flip-flops in a scan chain can make significant improvement in TDF coverage of skewed-load tests. However, such a method can not be applied to the broadside testing due to the requirement that a scan enable (SEN) signal remain high during the launch cycle in order to shift dummy flip-flop values to the functional flip-flops. Thus, in one embodiment of the present invention, a separate control signal is provided for the enhanced scan flip-flop to overcome the above mentioned requirement so as to be suitable for the broadside testing. As shown in FIG. 2, the enhanced flip-flop also called an Enhanced Scan (ES) flip-flop 200 includes a first flip-flop (FF1) 202 and a second flip-flop (FF2) 204. The second flip-flop 204 may correspond to a standard two-port flip-flop whose output Q drives the combinational logic of the circuit under test.

The ES flip-flop 200 includes an additional control input called an ESM signal 206 which controls a multiplexer select line for the second flip-flop 204. A SEN signal 208 controls the select inputs of a scan flip-flop which has not been replaced with the enhanced scan flip-flop. The SEN signal 208 controls the select input of the first flip-flop of the ES flip-flop 200. A functional data input (D) 210 to the flip-flop, is connected to both the first flip-flop and the second flip-flop.

In a scan chain, the second flip-flop 204 of the ES flip-flop 200 is connected to the scan-in input (SIN) 212 of the next scan flip-flop in the chain. In one embodiment, a global ESM signal that is connected to all the ES flip-flops in the tested circuit may be derived either from a primary input or through a programmable register inserted in a border scan (such as JTAG) controller.

Referring now to FIG. 3, a table 300 of scan flip-flop operation modes supported by the ES flip-flop is shown. For a Functional mode or a Standard broad side test mode, the SEN signal and ESM signal are set to 0. Both the first flip-flop and the second flip-flop may latch the value on the D input (the next-state value produced by the combinational logic of the circuit).

For a Scan shift mode, the SEN signal and ESM signal are set to 1 and all the flip-flops are in a scan mode. In the Scan shift mode, the initialization vector of a two-pattern test can be scanned in while the tested circuit response to the previous test is shifted out. The Scan shift Mode may allow scanning in extra values which can be used to improve the test coverage.

An additional mode of operation for the broadside testing, which is an Enhanced broadside test mode, is supported by the ES flip-flop. The Enhanced broadside test mode is obtained with SEN=0 and ESM=1 during the launch and capture cycles. During the Enhanced broadside test mode, the non-augmented scan flip-flops (i.e. the standard scan cells) operate as in standard broadside tests. The ES flip-flops operate as follows. During the launch cycle, content of the first flip-flop is shifted into the second flip-flop. During the capture cycle, the test response is captured in the first flip-flop. Consequently, the state latched in the first flip-flop at the end of the initialization phase is used as the present-state of the second flip-flop in the launch cycle. It is to be noted that this is different from the state obtained during any conventional broadside testing (with standard two port flip-flops) where the second flip-flop obtains its value from the D input.

In an embodiment of the present invention, the ES flip-flop supports two modes of broadside testing such as a standard broadside testing (with SEN=ESM=0) and an enhanced broadside testing (with SEN=0 and ESM=1). High TDF coverage may be obtained through the enhanced broadside testing. It is important to note that both the broadside test modes use SEN=0 and that both the SEN signal and the ESM signal are constant during the launch and capture cycles just as in standard broadside tests. Thus, neither the SEN signal nor the ESM signal needs to be designed to be fast (at-speed). In practice, testers can mix the two modes of broadside testing through use of ES flip-flops to achieve higher test coverage and to reduce test pattern counts.

In a further embodiment of the present invention, all the flip-flops in the scan chain may be replaced with ES flip-flops. This may allow arbitrary pairs of tests to be applied as in other prior art scan designs such as three latch enhanced scan designs, and the like. The ES flip-flops do not require a fast control signal or an extra clock needed while three latch enhanced scan designs require the fast control signal and/or the extra clock.

Subset of Flip-Flop Selection

In an embodiment, the desirable subset of scan flip-flops may be selected through various topology-based heuristic methods. Examples of a topology-based heuristic method include, but not limited to, a static greedy algorithm, a dynamic greedy algorithm, or the like. It is contemplated that various methods and algorithm can be implemented to select a desirable subset of scan flip-flops without departing from the scope and spirit of the present invention. An exemplary greedy procedure to select the subset of scan flip-flops in accordance with an embodiment of the present invention may implement a two-phase greedy algorithm. The exemplary greedy procedure is described as follows.

Definition

1) FD is defined to denote a set of transition delay faults that can be detected with an enhanced scan, which allows arbitrary two-pattern tests. 2) $FD_b$ is defined to denote a set of faults that are detected using standard broadside testing. FD_1 is defined to be FD_1=(FD–$FD_b$), representing another set of faults that should be targeted for detection by broadside testing through use of the enhanced scan flip-flops proposed in this invention. 3) $f_i$ is defined as a delay fault. A scan flip-flop $s_k$ is said to affect the fault $f_i$, if $s_k$ is in the input cone of the circuit line corresponding to $f_i$. 4) S_1 is defined as a set of scan flip-flops that are in the input cone of all faults in the set FD_1, i.e., S_1={s|s affects f for some f∈FD_1}. From S_1, a pruned and ordered list of flip-flops S_2⊆S_1 is obtained through a two-phase greedy procedure. 5) rank (s), which is the rank of a flip-flop s, is defined as the number of faults in FD_1 that s affects.

Example Procedure

An exemplary pseudo-code of the greedy procedure to select the subset of scan flip-flops in accordance with an embodiment of the present invention is as follows:

---

Procedure Select_Flip-Flops(S_1, FD_1 )
Phase I:
STEP 1: Order the flip-flops in S_1 randomly. Set A = FD_1. Let $s_i$ denote the i$^{th}$ flip-flop in the ordered set S_1. Let N be the number of flip-flops in S_1.
STEP 2: DO for i = 1 to N:
    IF $s_i$ affects some fault f ∈ A, delete from an every fault f such that $s_i$ affects f.
    ELSE delete $s_i$ from S_1.
/* At the end of Phase I, the size of S_1 is reduced */
Phase II:
STEP 1: For every s ∈ S_1 , compute rank (s). Let M be the number of flip-flops in S_1.
Set S_2 = Ø
STEP 2: WHILE S_1 ≠ Ø, DO
    Pick the flip-flop $s_{max}$ with the highest rank in S_1 (in case of a tie pick one randomly)
    Add $s_{max}$ to S_2
    For every f ∈ FD_1, if $s_{max}$ affects f then delete f from FD_1. Delete $s_{max}$ from S_1
    Compute the ranks of the flip-flops in S_1 using the reduced set FD_1.

---

For example, FD_1 may include {f1, f2, f3, f4, f5, f6, f7, f8, f9, f10, f11} and S_1 may include {s1, s2, s3, s4, s5, s6, s7} which may be the subset of scan flip-flops that affect the faults in FD_1. As shown in FIG. 4A, the faults from FD_1 that are affected by each flip-flop in S_1. Then, the flip-flops in S_1 are ordered in increasing order of their numerical indices. During Phase I of the proposed procedure, beginning with s1, each flip-flop is checked if it affects a fault in FD_1 that is not already affected by previous flip-flops. It may be the case that the faults affected by s4, for example f1, f4, f8, are affected by flip-flops s1 and s3. Flip-flops s1 and s3 have been considered previously. Consequently, s4 is dropped from the set S_1. Similarly, s7 is also dropped because the fault f10 is affected by s5. Thus, S_1 may result in including {s1, s2, s3, s5, s6} at the end of Phase I.

FIG. 4B shows the affected faults and the rank of each flip-flop at the start of Phase II. In the first iteration, s3 is selected, removed from S_1 and added to S_2. The faults {f1, f2, f5, f7, f8, f9} are removed from the set FD_1. The ranks of the remaining flip-flops in S_1 is computed based on the new DF'={f3, f4, f6, f10, f11} as shown in FIG. 4C. s6 is selected in the next iteration and added to the set S_2. The new FD_1={f4, f10} and S_1={s1, s2, s5} are obtained by removing the faults affected by s6 from FD_1 as well as removing s6 from S_1. Since s2 does not affect any faults in the FD_1, it is removed from S_1. The new ranks of the remaining flip-flops s1 and s5 are shown in FIG. 4D. Since both have the same rank, one of them is selected. The remaining flip-flop is selected in the last iteration, resulting in S_2={s3, s6, s1, s5}.

FIG. 5 is a flow diagram of a method 500 implemented in accordance with an exemplary embodiment of the present invention. The method 500 may include steps as follows. A scan chain is provided in Step 502. A subset of scan flip-flops to be replaced with ES flip-flops may be selected from the scan chain in Step 504. The desirable subset of scan flip-flops may be selected through various topology-based heuristic methods. Examples of a topology-based heuristic method include a static greedy algorithm, a dynamic greedy algorithm, or the like. Then, the selected subset of scan flip-flops may be replaced with ES flip-flops in Step 506. Accordingly, the scan chain may be formed with standard scan flip-flops and ES flip-flops, which is suitable for being utilized in the enhanced broadside testing.

The present invention may provide various advantages over conventional delay fault test schemes. The skewed-load testing approach as well as enhanced scan methods may provide higher delay test coverage than the broadside testing approach. However, the broadside testing does not require fast signals, which is desirable for many designs. The method of the present invention implements an enhanced broadside testing. Since the present invention implements clocking similar to the broadside testing, it does not require control signals to operate at-speed during test. In practice, users are allowed to mix the two modes of broadside testing through use of ES flip-flops to achieve a desirable level of delay fault test coverage and to reduce test pattern counts.

In the exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the present invention. The accompanying method claims present elements of the various steps in a sample order, and are not necessarily meant to be limited to the specific order or hierarchy presented.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for delay fault testing in a circuit, comprising steps of:
    providing a scan chain;
    selecting a subset of scan flip-flops from said scan chain; and
    replacing said subset of scan flip-flops with a plurality of Enhanced Scan flip-flops, each of said plurality of Enhanced Scan flip-flops comprising a first flip-flop including a first multiplexer, a second flip-flop communicatively coupled to said first flip-flop including a second multiplexer, a functional data input coupled to said first multiplexer and said second multiplexer, a scan input coupled to said first multiplexer, said scan input for receiving signals from an adjacent flip-flop in a scan chain wherein an output of said adjacent scan flip-flop is coupled to said first flip-flop, a SEN (scan enable) control input for providing a SEN signal to said first flip-flop, said SEN control input selecting said first multiplexer of said first flip-flop to provide an input of said first flip-flop with one selected from said functional data input and said scan input, and a ESM control input for providing a ESM signal to said second flip-flop, said ESM control input selecting said second multiplexer of said second flip-flop to provide an input of said second flip-flop with one selected from said functional data input and an output of said first flip-flop,
    wherein each of said plurality of Enhanced Scan flip-flops is configurable for operating at least one Enhanced Scan flip-flop mode.

2. The method as described in claim 1, wherein said ESM signal is not an at-speed signal.

3. The method as described in claim 1, wherein said subset of scan flip-flops is selected through a topology based heuristic method.

4. The method as described in claim 1, wherein content of said first flip-flop is configured to be shifted into said second flip-flop during a launch cycle.

5. The method as described in claim 4, wherein said first flip-flop is configured to capture a test response during a capture cycle.

6. The method as described in claim 4, wherein a state launched in said first flip-flop at the end of the initialization phase is used as a present state of said second flip-flop during said launch cycle.

7. The method as described in claim 1, wherein said plurality of Enhanced Scan flip-flops are coupled to a single ESM signal which is derived from a primary input of said circuit.

8. The method as described in claim 1, wherein said plurality of Enhanced Scan flip-flops are coupled to a single ESM signal which is derived from a programmable register.

9. The method as described in claim 1, wherein said Enhanced Scan flip-flop modes include a Functional mode, a Standard broadside test mode, an Enhanced broadside test mode, and a Scan shift mode.

10. The method as described in claim 9, wherein a desired mode of said Enhanced Scan flip-flop modes is selected through a combination of a SEN signal and said ESM signal.

11. A system for improving test delay fault coverage in a delay fault test of integrated circuits, comprising:
    means for providing a scan chain;
    means for selecting a subset of scan flip-flops from said scan chain; and
    means for replacing said subset of scan flip-flops with a plurality of Enhanced Scan flip-flops, each of said plurality of Enhanced Scan flip-flops comprising a first flip-flop including a first multiplexer, a second flip-flop communicatively coupled to said first flip-flop including a second multiplexer, a functional data input coupled to said first multiplexer and said second multiplexer, a scan input coupled to said first multiplexer, said scan input for receiving signals from an adjacent flip-flop in a scan chain wherein an output of said adjacent scan flip-flop is coupled to said first flip-flop, a SEN (scan enable) control input for providing a SEN signal to said first flip-flop, said SEN control input selecting said first multiplexer of said first flip-flop to provide an input of said first flip-flop with one selected from said functional data input and said scan input, and a ESM control input for providing a ESM signal to said second flip-flop, said ESM control input selecting said second multiplexer of said second flip-flop to provide an input of said second flip-flop with one selected from said functional data input and an Output of said first flip-flop,
    wherein each of said plurality of Enhanced Scan flip-flops includes a first flip-flop and a second flip-flop which are both coupled to a functional data input, content of said first flip-flop is shifted into said second flip-flop during a launch cycle, and said first flip-flop captures a test response during a capture cycle.

12. The system as described in claim 11, wherein a state launched in said first flip-flop at the end of an initialization phase is used as a present state of said second flip-flop during said launch cycle.

13. The system as described in claim 11, wherein said each of said plurality of Enhanced Scan flip-flops supports Enhanced scan flip-flop modes which include a Functional mode, a Standard broadside test mode, an Enhanced broadside test mode, and a Scan shift mode.

14. The system as described in claim 13, wherein a desired mode of said Enhanced Scan flip-flop modes is selected through a combination of a SEN signal and said ESM signal.

15. The system as described in claim 11, wherein said scan chain having said replaced subset of scan flip-flops is configurable for an enhanced broadside test to be applied.

16. An enhanced scan flip-flop for improving a test delay fault coverage for enhanced broadside testing of a circuit, comprising:
    a first flip-flop including a first multiplexer;
    a second flip-flop communicatively coupled to said first flip-flop including a second multiplexer;

a functional data input coupled to said first multiplexer and said second multiplexer;

a scan input coupled to said first multiplexer, said scan input for receiving signals from an adjacent flip-flop in a scan chain, wherein an output of said adjacent scan flip-flop is coupled to said first flip-flop;

a SEN (scan enable) control input for providing a SEN signal to said first flip-flop, said SEN control input selecting said first multiplexer of said first flip-flop to provide an input of said first flip-flop with one selected from said functional data input and said scan input; and a ESM control input for providing a ESM signal to said second flip-flop, said ESM control input selecting said second multiplexer of said second flip-flop to provide an input of said second flip-flop with one selected from said functional data input and an output of said first flip-flop, wherein content of said first flip-flop is shifted into said second flip-flop during a launch cycle and said first flip-flop captures a test response during a capture cycle.

17. The enhanced scan flip-flop as described in claim 16, wherein said enhanced scan flip-flop is configurable for operating Enhanced Scan flip-flop modes.

18. The enhanced scan flip-flop as described in claim 17, wherein said Enhanced Scan flip-flop modes, which include a functional mode, a standard broadside test mode, an enhanced broadside test mode, and a scan shift mode, are selected through a combination of said SEN signal and said ESM signal.

19. The enhanced scan flip-flop as described in claim 18, wherein said standard broadside test mode and said enhanced broadside test mode may be mixed whereby a desirable level of delay fault test coverage is achieved.

20. The enhanced scan flip-flop as described in claim 16, wherein said enhanced scan flip-flop is configurable for replacing a scan flip-flop of a scan chain.

* * * * *